United States Patent
Rabary et al.

(10) Patent No.: US 7,113,031 B2
(45) Date of Patent: Sep. 26, 2006

(54) AUDIO AMPLIFIER CIRCUIT WITH SUPPRESSION OF UNWANTED NOISE WHEN POWERED ON FROM STANDBY

(75) Inventors: Vincent Rabary, Grenoble (FR); Frédéric Goutti, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 27 days.

(21) Appl. No.: 10/816,126

(22) Filed: Apr. 1, 2004

(65) Prior Publication Data

US 2004/0196099 A1    Oct. 7, 2004

(30) Foreign Application Priority Data

Apr. 1, 2003    (FR) .................................. 03 04068

(51) Int. Cl.
*H03M 1/14*    (2006.01)
(52) U.S. Cl. .......................................... 330/51; 330/69
(58) Field of Classification Search ................. 330/51, 330/69, 110, 149
See application file for complete search history.

(56) References Cited

U.S. PATENT DOCUMENTS

| | | | | |
|---|---|---|---|---|
| 4,433,306 A | | 2/1984 | Honda et al. | |
| 4,498,020 A | * | 2/1985 | Giolma et al. | 327/101 |
| 4,983,927 A | * | 1/1991 | Torazzina | 330/51 |
| 5,194,821 A | * | 3/1993 | Brambilla et al. | 330/51 |
| 5,363,062 A | * | 11/1994 | Nebuloni et al. | 330/51 |
| 5,420,535 A | * | 5/1995 | Nebuloni et al. | 330/51 |
| 5,642,074 A | | 6/1997 | Ghaffaripour et al. | |
| 5,648,742 A | | 7/1997 | Ghaffaripour et al. | |
| 5,703,529 A | | 12/1997 | Ghaffaripour et al. | |
| 5,828,245 A | * | 10/1998 | Brambilla et al. | 327/108 |
| 5,939,938 A | | 8/1999 | Kalb et al. | |
| 6,346,854 B1 | | 2/2002 | Heithoff | |
| 6,441,762 B1 | * | 8/2002 | Angelici et al. | 341/150 |
| 6,636,084 B1 | * | 10/2003 | Sarraj | 327/95 |
| 6,753,691 B1 | * | 6/2004 | Lasalandra et al. | 324/686 |
| 6,940,348 B1 | * | 9/2005 | Confalonieri et al. | 330/69 |

OTHER PUBLICATIONS

French Search Report from French Patent Application 03/04068, filed Apr. 1, 2003.

* cited by examiner

*Primary Examiner*—Lam T. Mai
(74) *Attorney, Agent, or Firm*—Lisa K. Jorgenson; William R. McClellan; Wolf, Greenfield & Sacks, P.C.

(57) ABSTRACT

A power amplifier circuit comprising at least one first amplifier having a first input receiving an input voltage through at least one first coupling capacitor and connected to an output of the first amplifier, and having a second input, separate from the first input, receiving a reference voltage supplied by a time constant circuit comprising a decoupling capacitor, at least one first controllable switch connecting the first and second inputs.

20 Claims, 3 Drawing Sheets

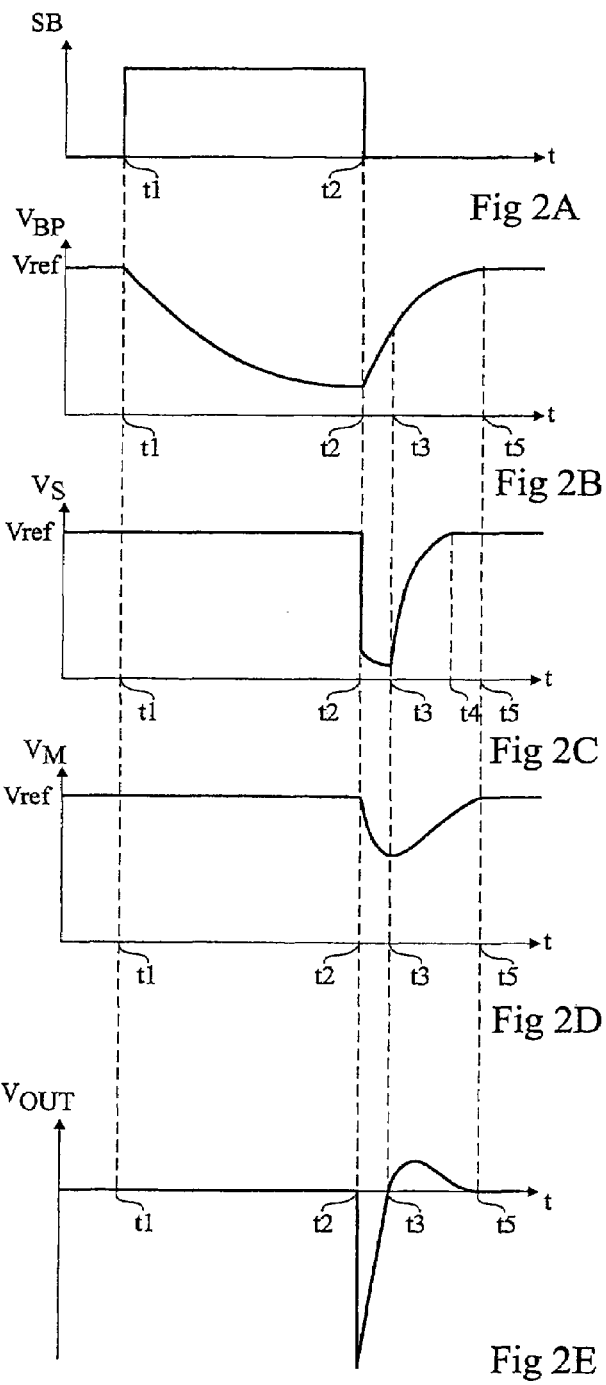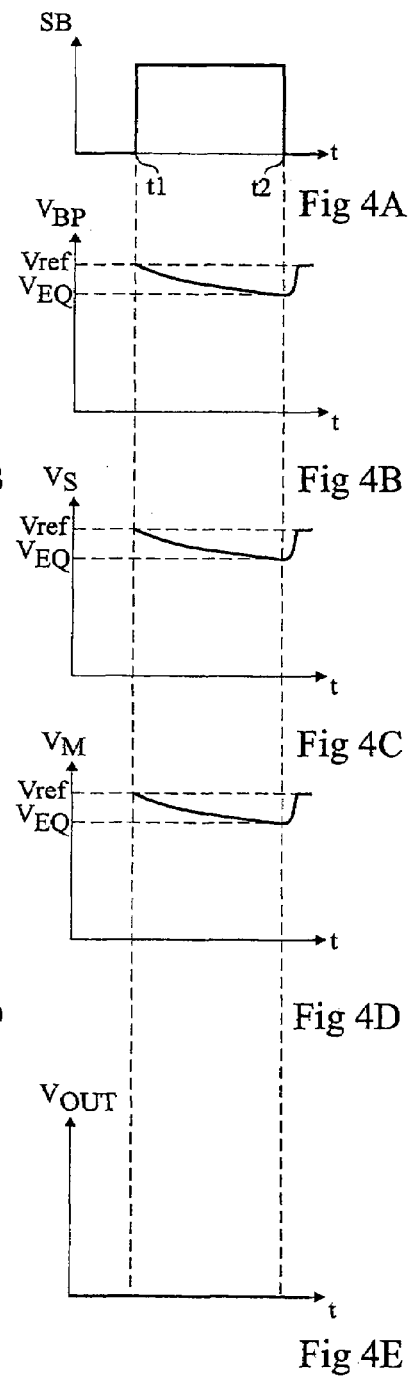

AUDIO AMPLIFIER CIRCUIT WITH SUPPRESSION OF UNWANTED NOISE WHEN POWERED ON FROM STANDBY

BACKGROUND OF THE INVENTION

1. Field of the Invention

The present invention relates to an amplifier circuit used in audio systems.

2. Discussion of the Related Art

FIG. 1 shows a conventional audio amplifier circuit comprising an operational amplifier 10. The inverting input (−) of amplifier 10 is connected to an input terminal E of the system by a resistor 11 and a coupling capacitor 12 assembled in series. Output S of amplifier 10 is connected to its inverting input (−) by a resistor 13. Output S is also connected to a terminal of a capacitor 14 having another terminal forming output OUT of the amplifier circuit. Output OUT is connected to one of the two terminals of a load Q, typically a loudspeaker capable of emitting sounds according to the voltage applied thereacross, having its other terminal connected to a low reference supply or ground GND of the circuit. Capacitor 14 has the function of decoupling output signal VL from the D.C. offset voltage created by amplifier 10. The wanted output signal present on terminal $V_{OUT}$ thus is a dynamic signal, applied on terminal E. The non-inverting input (+) of amplifier 10 is connected to midpoint BP of a resistive dividing bridge comprised of two resistors 15 and 16 connected in series between a high supply terminal VCC and ground GND. A controllable switch 17, generally an MOS transistor, is interposed between high supply VCC and resistor 15. A signal SB for setting to standby controls switch 17 and the power supply of amplifier 10. Upon setting to standby, signal SB causes the setting to a high impedance state of output S, the turning-off of switch 17, and the stopping of the current sources of amplifier 10, which results in a significant reduction in power consumption. A capacitor 18 is connected between node BP and ground GND, in parallel with resistor 16. Capacitor 18 has the function of filtering the noise generated by resistors 15 and 16 and of absorbing possible voltage variations at supply terminal VCC.

The divider formed of resistors 15 and 16 sets the voltage at node BP, and thus the charge level of capacitor 18, to a reference voltage which sets a bias voltage of the audio amplifier. For example, the reference voltage may be chosen to be equal to half of supply voltage VCC, and the values of resistors 15, 16 are then set to the same value. In normal operation, in the absence of a signal at input terminal E, the charges of capacitors 12, 14, and 18 are maximum. Voltages $V_M$ of node M and $V_{BP}$ of node BP are equal to the reference voltage, the voltage across load Q being then zero. When a voltage is applied to input terminal E, voltage $V_{IN}$ is equal to the reference voltage, to which is added the variable component of the input voltage, coupling capacitor 12 suppressing the D.C. component of the input voltage.

Voltage $V_{OUT}$ across load Q is equal to the variable component of the input voltage multiplied by the amplification gain $R_{13}/R_{11}$. By choosing an appropriate ratio of the values of resistors 11 and 13, the peak-to-peak voltage of load Q can be amplified.

FIGS. 2A to 2E are partial simplified timing diagrams illustrating the variation of voltages along time at certain points of the amplifier circuit of FIG. 1 upon and at the end of a setting to standby. FIG. 2A illustrates signal SB for setting to standby. FIG. 2B illustrates voltage $V_{BP}$, that is, the charge variation of decoupling capacitor 18. FIG. 2C illustrates voltage $V_S$ at output S of amplifier 10, that is, the charge variation of capacitor 14. FIG. 2D illustrates voltage $V_M$, that is, the charge variation of coupling capacitor 12. FIG. 2E illustrates voltage $V_{OUT}$ across load Q. A time when the circuit of FIG. 1 is on is considered as the time origin (t=0) and FIGS. 2B to 2E illustrate the variation of the signals upon setting to standby of the circuit at a time t1 and upon restarting at a subsequent time t2 from this standby state.

For clarity, a test situation in which no input signal is applied on terminal E connected to ground GND is considered hereafter. Then, between times t=0 and t=1 of setting to standby, the voltages at nodes M, BP and S are stable, equal to reference voltage Vref.

At time t1, signal SB switches state and takes a state adapted to controlling the turning-off of switch 17 and of interrupting the supply of amplifier 10, for example, switching from a low state to a high state. Such a state of signal SB, and thus, the stand-by, is maintained until a subsequent time t2. At time t2, signal SB returns to its initial state, for example, low, enabling the supply of amplifier 10 and the turning-on of switch 17.

During the standby, load Q is inhibited. Capacitor 18 discharges through resistor 16. Coupling and decoupling capacitors 12 and 14 do not significantly discharge, only by a leakage current through the load. For clarity, it is considered, as illustrated in FIGS. 2C and 2D, that capacitors 12 and 14 remain charged during standby.

At time t2, amplifier 10 is "awake", which causes an intermediary phase of discharge of capacitors 12 and 14. The discharge of capacitor 14, directly connected to load Q, is instantaneous and very fast. The discharge of capacitor 12 is delayed by resistors 11 and 13. The state switching of signal SB at time t2 also turns on switch 17. Decoupling capacitor 18 then charges through resistive divider 15, 16 to reference level Vref. This charge is transmitted to input and output capacitors 12 and 14 by copying of the voltage of node BP on node M. The intermediary discharge phase then ends at a time t3 after which capacitors 12 and 14 charge, as illustrated in FIGS. 2C and 2D, to reach the reference voltage. Capacitor 14, being charged by an amplified voltage, reaches the reference level at a time t4 prior to a time t5 at which coupling and decoupling capacitors 12 and 18 reach the reference level.

As illustrated in FIG. 2E, between times t2 and t5, voltage $V_{OUT}$ across load Q drops abruptly, then rapidly rises, crosses zero at time t3 and becomes positive before dropping back and stabilizing at a zero level at time t5. The positive peak appearing between times t3 and t4 translates as the transmission by loudspeaker Q of undesirable noise, unpleasant for the ear (pop noise).

To overcome this problem, various solutions have been provided. In particular, various modifications aiming at slowing down the discharge of decoupling capacitor 18 have been provided. However, such solutions also slow down its charge upon subsequent starting, which causes a relatively long latency time—that is, the duration separating time t5 of circuit stability from standby end time t2.

SUMMARY OF THE INVENTION

The present invention aims at providing an audio amplifier circuit that overcomes the disadvantages of existing audio amplifier circuits.

The present invention also aims at providing such a circuit that makes little or no unwanted noise at the powering-on of the circuit from a stand-by state.

The present invention also aims at providing such a circuit that can easily be made in the form of integrated circuits.

The present invention also aims at providing such a circuit that exhibits reduced latency times.

To achieve these and other objects, the present invention provides a power amplifier circuit comprising at least one first amplifier having a first input receiving an input voltage through at least one first coupling capacitor and connected to the output of the first amplifier, and having a second input, separate from the first input, receiving a reference voltage supplied by a time constant circuit comprising a decoupling capacitor, at least one first controllable switch connecting the first and second inputs.

According to an embodiment of the present invention, the output of the first amplifier is connected to a load by a second coupling capacitor, at least one second controllable switch connecting the output and the first input.

According to an embodiment of the present invention, a second amplifier receives at a first input the outputs of the first and second amplifiers, the second inputs of the first and second amplifiers being interconnected, the outputs of the first and second amplifiers being connected to respective terminals of a load.

According to an embodiment of the present invention, the second input is connected to the midpoint of a series connection between high and low supply terminals of first and second resistors.

According to an embodiment of the present invention, at least one second controllable switch, controlled at the same time as the first controllable switch, is interposed between the second resistor and the low supply terminal.

According to an embodiment of the present invention, a third controllable switch, controlled by a same signal as the first controllable switch, and of inverse control logic, is interposed between the high supply terminal and the first resistor.

BRIEF DESCRIPTION OF THE DRAWINGS

The foregoing objects, features, and advantages of the present invention are discussed in detail in the following non-limiting description of specific embodiments in connection with the accompanying drawings.

FIGS. 2A to 2E are timing diagrams illustrating signals sampled at various locations of the circuit of FIG. 1, upon powering-on thereof;

FIGS. 4A to 4E are partial simplified timing diagrams illustrating the variation of voltages along time at certain points of the amplifier circuit of FIG. 3, upon powering-on thereof.

DETAILED DESCRIPTION

Figure 1:
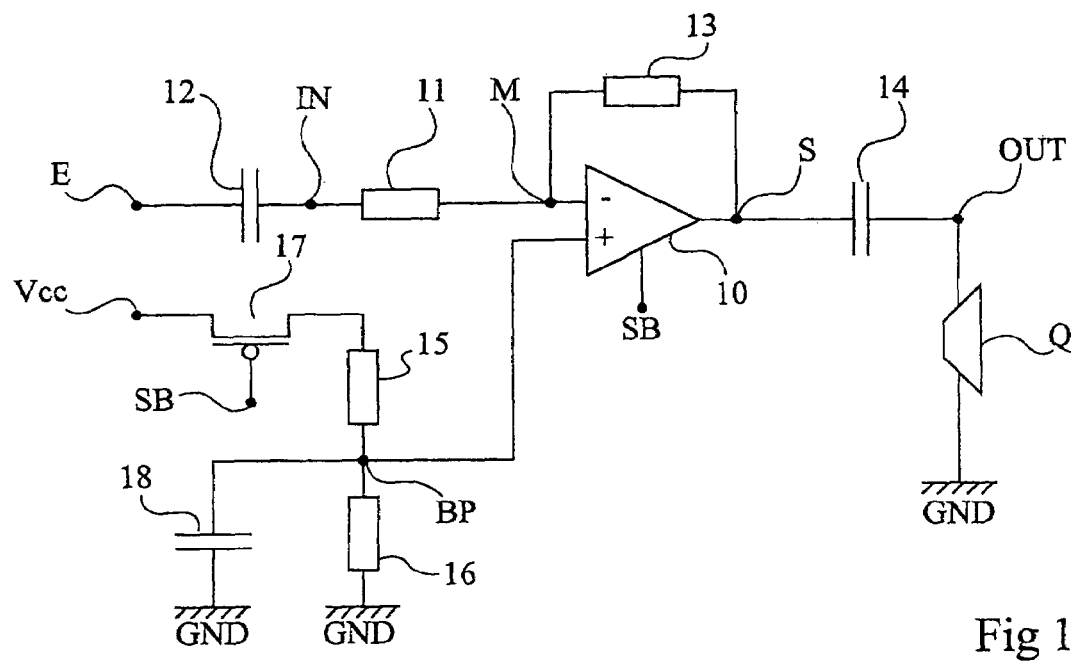
FIG. 1 schematically shows a conventional amplifier circuit architecture.

For clarity, the same reference numerals designate the same elements in the different drawings. Further, the timing diagrams of FIGS. 2A to 2E and 4A to 4E are not to scale.

A feature of the present invention is, upon setting to standby, to stabilize the capacitor charge levels.

Figure 3:
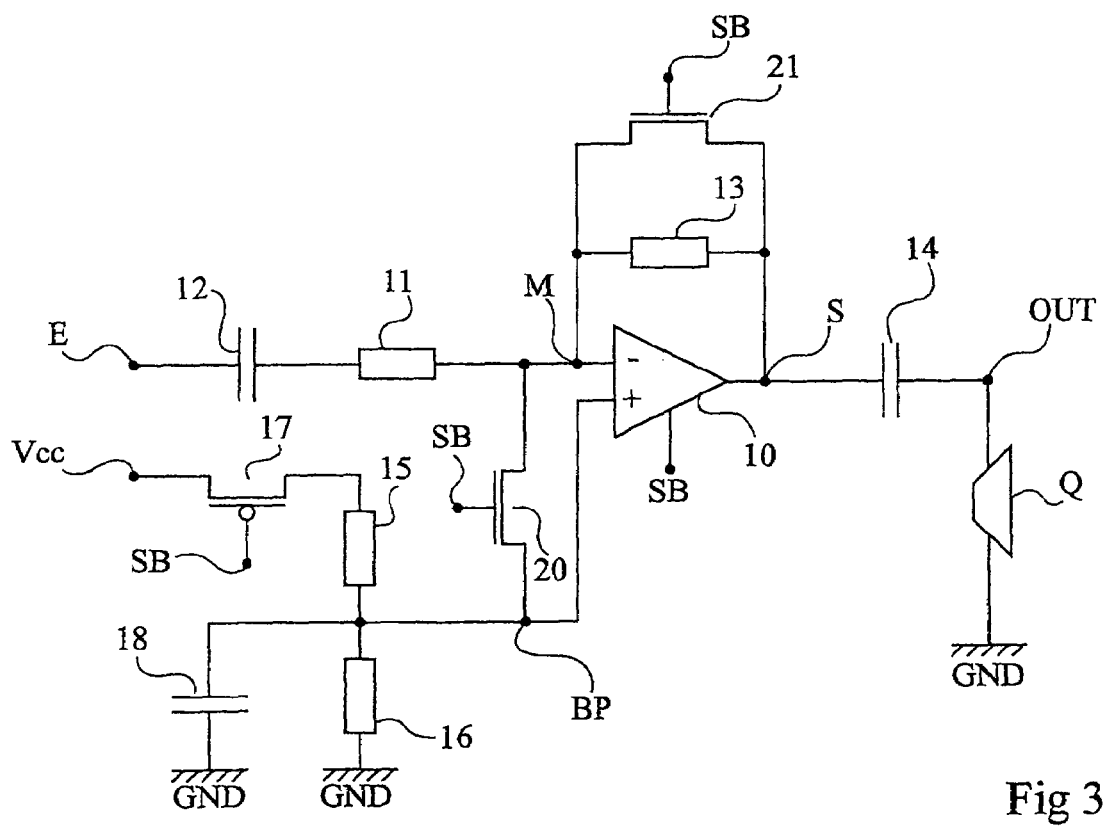
FIG. 3 shows an example of an architecture of an embodiment of an amplifier circuit according to the present invention.

FIG. 3 shows an example of an architecture of an amplifier circuit according to an embodiment of the present invention. The amplifier circuit comprises amplifier 10 and all the peripheral elements described in relation with FIG. 1. For simplicity, only the differences between FIG. 1 and FIG. 3 are described hereafter.

According to an aspect of the present invention, the amplifier circuit further comprises a controllable switch 20 connecting inverting input terminal (−) M and non-inverting input terminal (+) BP of amplifier 10. Switch 20 is controlled by standby signal SB. Switch 20 is chosen to be normally off in a normal circuit operation and to be on at standby. Switch 20 is, for example, an N-channel MOS transistor.

According to the embodiment of FIG. 3, the amplifier circuit also comprises another controllable switch 21 interconnecting output terminal S of amplifier 10 and its inverting input M. Switch 21 is also controlled by standby signal SB and exhibits the same off/on phases as switch 20. Switch 21 is, for example, an N-channel MOS transistor. As an alternative, switch 21 connects terminals S and BP.

FIGS. 4A to 4E are partial simplified timing diagrams illustrating the variation of voltages along time at certain points of the amplifier circuit of FIG. 3, upon setting to standby and at the end thereof. These drawings should be compared with previously-described FIGS. 2A to 2E. FIG. 4A illustrates standby signal SB. FIG. 4B illustrates voltage $V_{BP}$ at node BP, that is, the variation of the charge of decoupling capacitor 18. FIG. 4C illustrates voltage $V_S$ at output S of amplifier 10, that is, the variation of the charge of capacitor 14. FIG. 4D illustrates voltage $V_M$ at node M, that is, the variation of the charge of coupling capacitor 12. FIG. 4E illustrates voltage $V_{OUT}$ across load Q.

A time when the circuit of FIG. 1 is on is considered as the time origin (t=0) and FIGS. 4B to 4E illustrate the variation of the signals upon setting to standby of the circuit at a time t1 and upon restarting, from this standby state, at a subsequent time t2.

At the setting of the circuit to standby, standby signal SB switches state, turning off switch 17 and turning on switches 20 and 21, thus blocking the supply of amplifier 10.

Then, the charge levels of the three capacitors 12, 14, 18 balance. The discharge of capacitor 18 into resistor 16 is slowed down by the two other capacitors 12 and 14. The discharge is more symmetrical, identical for all capacitors, and voltage levels $V_S$, $V_M$, and $V_{BP}$ at the end of standby are equal to a level $V_{EQ}$. Level $V_{EQ}$, for the standby duration, is much greater than the level normally reached by capacitor 18 at the end of a standby state with a conventional amplifier circuit, as illustrated by the comparison of FIGS. 2B and 4B. In practice, capacitor 14 imposes a very long time constant on the order of 30 seconds. Output voltage $V_{OUT}$ across load Q remains stable, at zero.

At standby end time t2, switches 20 and 21 are controlled to be turned off while switch 17 turns on and amplifier 10 is supplied. Voltages $V_{BP}$, $V_S$, and $V_M$ being equal, the variation of voltage $V_{OUT}$ is, in the worst case ($V_{EQ}=0$), at most sufficient to translate as residual low-intensity noise (not shown) which normally appears upon first starting of the circuit, that is, from a total stop state.

The present invention thus eliminates the pop noise normally appearing upon restarting from a standby signal.

According to an alternative (not shown in FIG. 3), to avoid discharge of capacitors 12, 14, and 18, an additional switch of same control logic as switch 17 is interposed between low resistor 16 of the dividing bridge and ground GND. Upon setting to standby at time t1, this switch turns off. The discharge of the capacitors is then limited to leakage currents, for example, in load Q, and/or in the different off switches. As illustrated in dotted lines in the timing diagrams of FIGS. 4B to 4D, nodes BP, S, and M, respectively, are then maintained at reference voltage Vref. Output voltage $V_{OUT}$ across load Q remains always stable, at zero, as illustrated in FIG. 4E, and the occurrence of residual noise is suppressed.

The occurrence of unwanted noise at the exit from a standby state of an amplifier circuit has been described previously in relation with a structure comprising a single operational amplifier 10. However, this problem also appears in a so-called bridge tiled load (BTL) structure with two operational amplifiers in cascade to which the present invention also applies.

Figure 5:
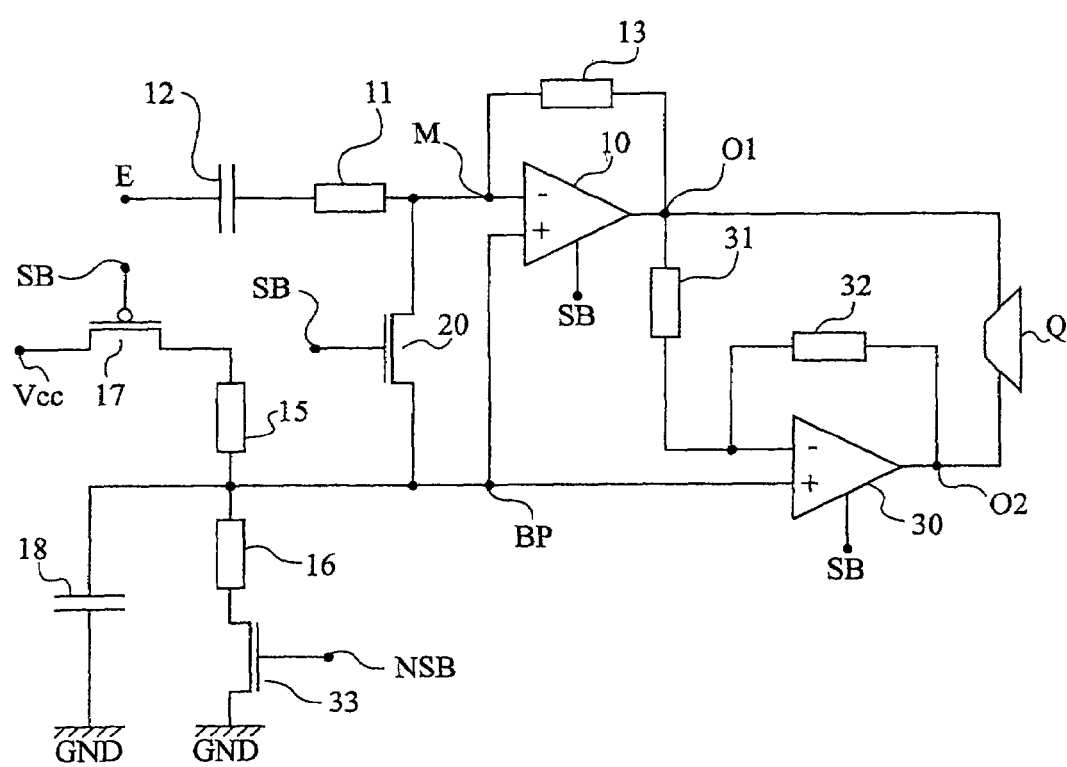
FIG. 5 shows an example of an architecture of another embodiment of an amplifier circuit according to the present invention.

FIG. 5 illustrates another embodiment of the present invention, applied to such a bridge assembly. The amplifier circuit comprises amplifier 10 and all its peripheral elements described in relation with FIG. 1, except for output decoupling capacitor 14, which is eliminated. Output O1 of amplifier 10 is then directly connected to a terminal of load Q having its other terminal connected to output O2 of a second operational amplifier 30. Second amplifier 30 is assembled as an inverter. The inverting input (−) of amplifier 30 is connected to output O1 of amplifier 10 by a resistor 31 and to its output O2 by a resistor 32. The non-inverting input (+) of amplifier 30 is connected to node BP that forms the non-inverting input of the amplifier circuit.

Node BP is connected, as described previously in relation with FIG. 1, to the midpoint of a resistive dividing bridge. However, as illustrated in FIG. 5, the dividing bridge further comprises a controllable switch 33 between resistor 16 and ground GND. Switch 33 is a switch of the same control logic as switch 17. In the shown example, switch 33 is controlled by inverse NSB of signal SB, switch 17 being a P-channel MOS transistor and switch 33 being an N-channel MOS transistor.

According to the embodiment of FIG. 5, the bridge-assembled amplifier circuit further comprises switch 20 interconnecting terminals M and BP.

As compared to the architecture of FIG. 3, switch 21 is eliminated. Indeed, switch 21 is not necessary in the absence of output decoupling capacitor 14. The decoupling capacitor is no longer necessary in the bridge assembly of FIG. 5, given that the D.C. components of amplifiers 10 and 30 compensate for each other.

The presence of switch 20 according to a feature of the present invention enables, as previously discussed in relation with FIG. 3 for an assembly with a single amplifier 10, stabilizing the charges of coupling and decoupling capacitors 12 and 18 by balancing their discharge. Further, the introduction of switch 33 enables, as discussed in relation with the alternative of FIG. 3, avoiding discharge of the capacitors through resistor 16. Voltages $V_M$ and $V_{BP}$ are thus equal to reference level Vref (neglecting leakage) at the end of a standby.

Of course, the present invention is likely to have various alterations, modifications, and improvements which will readily occur to those skilled in the art. In particular, those skilled in the art will be able to choose elements capable of implementing the desired operation. For example, operational amplifiers 10 and 30 may be replaced with any element performing the same function. Similarly, those skilled in the art will be able to appropriately choose and control switches 17, 20, 21, and 33. The switches have been previously described as being switches controllable to be turned on and to be turned off. They may however be normally-on or off switches controllable to be turned off or to be turned on by signal SB.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power amplifier circuit comprising at least one first amplifier having a single output, a first input receiving an input voltage through at least one first coupling capacitor and connected to the single output of the first amplifier, and having a second input, separate from the first input, receiving a reference voltage supplied by a time constant circuit comprising a decoupling capacitor, at least one first controllable switch connecting the first and second inputs wherein the first controllable switch connects the first and second inputs together when in an on state.

2. The circuit of claim 1, wherein the first controllable switch connects directly the first and second inputs.

3. The circuit of claim 1, wherein the output of the first amplifier is connected to a load by a second coupling capacitor, at least one second controllable switch connecting the output and the first input.

4. The circuit of claim 1, further comprising a second amplifier, wherein a second amplifier receives at a first input the outputs of the first and second amplifiers, the second inputs of the first and second amplifiers being interconnected, the outputs of the first and second amplifiers being connected to respective terminals of a load.

5. The circuit of claim 1, wherein the second input is connected to the midpoint of a series connection between high and low supply terminals of first and second resistors.

6. The circuit of claim 5, wherein at least one second controllable switch, controlled at the same time as the first controllable switch, is interposed between the second resistor and the low supply terminal.

7. The circuit of claim 6, wherein a third controllable switch, controlled by a same signal as the first controllable switch, and of inverse control logic, is interposed between the high supply terminal and the first resistor.

8. A power amplifier circuit comprising:
a first amplifier having a first input, a second input and a single output;
a first coupling capacitor, connected to the first input, for receiving an input voltage;
a reference voltage circuit for supplying a DC reference voltage to the second input; and
a controllable switch connected between the first and second inputs, wherein the controllable switch connects the first and second inputs together when in an on state.

9. A power amplifier circuit as defined in claim 8, further comprising a second coupling capacitor for coupling the output of the first amplifier to a load and a second controllable switch connected between the output and the first input.

10. A power amplifier circuit as defined in claim 9, further comprising a feedback element connected between the output and the first input.

11. A power amplifier circuit as defined in claim 8, wherein the reference voltage circuit comprises first and second resistors forming a resistive divider, a junction point of the resistive divider connected to the second input, the reference voltage circuit further comprising a decoupling capacitor connected to the junction point of the resistive divider.

12. A power amplifier circuit as defined in claim 11, further comprising a second controllable switch connected in series with the second resistor, wherein the first and second controllable switches have inverse control logic.

13. A power amplifier circuit as defined in claim 12, further comprising a third controllable switch connected in series with the first resistor, the first and third controllable switches having inverse control logic.

14. A power amplifier circuit as defined in claim 8, further comprising a second amplifier having first and second inputs and an output, the first input of the second amplifier receiving the outputs of the first and second amplifiers, the second inputs of the first and second amplifiers being interconnected and the outputs of the first and second amplifiers being connected to respective terminals of a load.

15. A power amplifier circuit as defined in claim 14, wherein the reference voltage circuit comprises first and second resistors connected in series between high and low supply voltages to form a resistive divider, a junction point of the resistive divider connected to the second inputs of the first and second amplifiers, and a decoupling capacitor connected to a junction point of the resistive divider.

16. A power amplifier circuit as defined in claim 15, further comprising a second controllable switch connected in series with the second resistor, the first and second controllable switches having inverse control logic.

17. A power amplifier circuit as defined in claim 16, further comprising a third controllable switch connected in series with the first resistor, the first and third controllable switches having inverse control logic.

18. A method for operating a power amplifier comprising a first amplifier having a first input, a second input and a single output, a first coupling capacitor connected to the first input and a reference voltage circuit connected to the second input, said method comprising:

receiving an input voltage through the coupling capacitor;

receiving a DC reference voltage at the second input; and connecting the first and second inputs together in a standby mode.

19. A method as defined in claim 18, wherein connecting the first and second inputs comprises applying a standby signal to a first controllable switch connected between the first and second inputs.

20. A method as defined in claim 18, further comprising connecting the output of the first amplifier to a load by a coupling capacitor, and connecting the output and the first input together in the standby mode.

* * * * *

UNITED STATES PATENT AND TRADEMARK OFFICE
CERTIFICATE OF CORRECTION

PATENT NO. : 7,113,031 B2  Page 1 of 1
APPLICATION NO. : 10/816,126
DATED : September 26, 2006
INVENTOR(S) : Vincent Rabary and Frédéric Goutti It is certified that error appears in the above-identified patent and that said Letters Patent is hereby corrected as shown below:

Column 6, line 13 should read :
 amplifier having a single output, having a first input receiving an Column 6, line 29 should read:
 amplifier, wherein the second amplifier receives at a first input Signed and Sealed this Twenty-sixth Day of February, 2008

JON W. DUDAS
*Director of the United States Patent and Trademark Office*